(12) United States Patent
Zhang et al.

(10) Patent No.: US 10,829,847 B2
(45) Date of Patent: Nov. 10, 2020

(54) MASK PLATE AND METHOD FOR FABRICATING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jian Zhang, Beijing (CN); Zhiming Lin, Beijing (CN); Chunchieh Huang, Beijing (CN); Qi Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 161 days.

(21) Appl. No.: 16/118,641

(22) Filed: Aug. 31, 2018

(65) Prior Publication Data
US 2019/0062895 A1 Feb. 28, 2019

(30) Foreign Application Priority Data
Aug. 31, 2017 (CN) .......................... 2017 1 0774155

(51) Int. Cl.
| | | |
|---|---|---|
| C23C 14/04 | (2006.01) | |
| B23K 1/00 | (2006.01) | |
| H01L 51/56 | (2006.01) | |
| B05C 21/00 | (2006.01) | |
| C23C 14/24 | (2006.01) | |
| H01L 51/00 | (2006.01) | |

(52) U.S. Cl.
CPC .......... *C23C 14/042* (2013.01); *B05C 21/005* (2013.01); *B23K 1/0008* (2013.01); *H01L 51/56* (2013.01); *C23C 14/24* (2013.01); *H01L 51/0011* (2013.01)

(58) Field of Classification Search
None
See application file for complete search history.

(56) References Cited

U.S. PATENT DOCUMENTS

| | | | | |
|---|---|---|---|---|
| 2017/0222145 A1* | 8/2017 | Kim | .................... | H01L 51/0011 |
| 2018/0202034 A1* | 7/2018 | Lin | ....................... | C23C 14/042 |
| 2018/0239241 A1* | 8/2018 | Lv | .............................. | G03F 1/50 |
| 2019/0003033 A1* | 1/2019 | Bai | ....................... | B05C 21/005 |
| 2019/0078193 A1* | 3/2019 | Lin | ....................... | C23C 14/042 |

* cited by examiner

*Primary Examiner* — Jethro M. Pence
(74) *Attorney, Agent, or Firm* — Calfee, Halter & Griswold LLP

(57) ABSTRACT

A mask plate and a method for fabricating the same are disclosed. The mask plate includes a frame, mask strips fixed to the frame and extending in a first direction, and shielding strips having a same extending direction as that of the mask strips. The shielding strips are arranged in space between neighboring mask strips and shield a gap between neighboring mask strips. Each shielding strip includes a first border parallel with the first direction. Each shielding strip is provided with a first location hole at both ends of its extending direction. Some or all of the shielding strips have widths in a direction perpendicular to the first direction which are different from one another. Distances between centers of the first location holes of each shielding strip and the first border of the shielding strips lie in a first threshold range.

18 Claims, 8 Drawing Sheets

MASK PLATE AND METHOD FOR FABRICATING THE SAME

RELATED APPLICATIONS

The present application claims the benefit of Chinese Patent Application No. 201710774155.4, filed Aug. 31, 2017, the entire disclosure of which is incorporated herein by reference.

TECHNICAL FIELD

The present disclosure relates to the field of semiconductor technologies, and particularly to a mask plate and a method for fabricating the same.

BACKGROUND

The display type currently comprises liquid crystal display (LCD), organic light-emitting diode (OLED), plasma display panel (PDP), and electronic ink display. An OLED display device is considered as the third generation display technique following a LCD display device. Due to advantages of lightness in weight, active light emission, fast response speed, wide viewing angle, richness in color, high luminance, low power consumption, resistance to high and low temperature, the OLED display device can be widely applied to terminal products like a smart mobile phone, a tablet computer, and a TV set.

In a fine metal mask (FMM Mask) mode, red, green, and blue organic light emitting materials are evaporated on desired positioned of a backplate of low temperature polycrystalline silicon according to a preset program, through patterns in the fine mask plate. Currently, the fine mask plate generally comprises a plurality of mask strips which are arranged in parallel. Each of the mask strips is provided with a plurality of openings for evaporating pixel materials. Further, the mask plate further comprises shielding strips which have a same extending direction as that of the mask strips and are used to shield a space between two neighboring mask strips, and supporting strips which have an extending direction perpendicular to that of the mask strips and are used to support the mask strips. Both the shielding strips and the supporting strips have to be soldered on the frame.

SUMMARY

Embodiments of the present disclosure provide a mask plate, comprising: a frame and a plurality of mask strips which are fixed to the frame and extend in a first direction, each of the mask strips is provided with a plurality of openings, wherein the mask plate further comprises a plurality of shielding strips having a same extending direction as that of the mask strips, the shielding strips are arranged in space between neighboring mask strips and shield a gap between neighboring mask strips, wherein each of the shielding strips comprises a first border parallel with the first direction, and each of the shielding strips is provided with a first location hole at both ends of its extending direction, some or all of the shielding strips have widths in a direction perpendicular to the first direction which are different from one another, and distances between centers of the first location holes of each of the shielding strips and the first border of the shielding strips lie in a first threshold range.

In one or more embodiments, distances between centers of the first location holes of each of the shielding strips and the first border of the shielding strips are a first preset value, and the first preset value is a specific value in the first threshold range.

In one or more embodiments, the mask plate further comprises a plurality of supporting strips which support the mask strips and have an extending direction perpendicular to that of the mask strips, wherein each of the supporting strips comprises a second border perpendicular to the first direction, and each of the supporting strips is provided with a second location hole at both ends of its extending direction, some or all of the supporting strips have widths in the first direction which are different from one another, and distances between centers of the second location holes of each of the supporting strips and the second border of the supporting strips lies in a second threshold range.

In one or more embodiments, distances between centers of the second location holes of each of the supporting strips and the second border of the supporting strips are a second preset value, and the second preset value is a specific value in the second threshold range.

In one or more embodiments, each of the shielding strips is further provided with a third location hole at both ends of its extending direction, and the third location hole and the first location hole at a same end are symmetrical with respect to a central axis of the shielding strips which is parallel with the first direction; and each of the supporting strips is further provided with a fourth location hole at both ends of its extending direction, and the fourth location hole and the second location hole at a same end are symmetrical with respect to a central axis of the supporting strips which is perpendicular to the first direction.

In one or more embodiments, the mask plate further comprises auxiliary shielding strips which are arranged in a same layer as and are parallel with the shielding strips, wherein each of the auxiliary shielding strips comprises a shielding strip body and shielding strip branches at both sides of the shielding strip body, the shielding strip body has a width in a direction perpendicular to the first direction which is larger than a width of the shielding strip branches in a direction perpendicular to the first direction, the shielding strip body comprises a first auxiliary border which is parallel with the first direction, and each of the shielding strips bodies is provided with a first auxiliary location hole at both ends of its extending direction, distances between centers of first auxiliary location holes of each of the auxiliary shielding strips and the first auxiliary border of the auxiliary shielding strips lie in the first threshold range.

In one or more embodiments, each of the auxiliary shielding strips further comprises a first extending portion which is arranged at a side of each of the shielding strip branches away from the shielding strip body, a width of the first extending portion in a direction perpendicular to the first direction is a first preset width, and the first extending portion increases the sensed area of the auxiliary shielding strips, when the auxiliary shielding strips are transferred to an alignment base by sensing during fabrication.

In one or more embodiments, the mask plate further comprises auxiliary supporting strips which are arranged in a same layer as and parallel with the supporting strips, wherein each of the auxiliary supporting strips comprises a supporting strip body and supporting strip branches on both sides of the supporting strip body, and the supporting strip body has a width in the first direction which is larger than that of the supporting strip branches; the supporting strip body comprises a second auxiliary border which is perpendicular to the first direction, and each of the supporting strip bodies is provided with a second auxiliary location hole at both ends of its extending direction; distances between centers of the second auxiliary location holes of each of the auxiliary supporting strips and the second auxiliary border of the auxiliary supporting strips lie in a second threshold range.

In one or more embodiments, each of the auxiliary supporting strips further comprises a second extending portion which is arranged at a side of each of the supporting strip branches away from the supporting strip body, a width of the second extending portion in the first direction is a second preset width, the second extending portion increases the sensed area of the auxiliary supporting strips, when the auxiliary supporting strips are transferred to the alignment base by sensing during fabrication.

In one or more embodiments, the shielding strips have a width in a direction perpendicular to the first direction which is smaller than a third preset value are used as shielding sub-strips, and each of the shielding sub-strips is further provided with a first sensing portion in a first preset region, the first sensing portion increases the sensed area of the shielding sub-strips when the shielding sub-strips are transferred to the alignment base by sensing during fabrication, and the first preset region is a region of each of the shielding sub-strips which corresponds to a preset sensing region during transferring the shielding strips; and the supporting strips which have widths in the first direction smaller than a fourth preset value are used as supporting sub-strips, each of the supporting sub-strips is further provided with a second sensing portion in a second preset region, the second sensing portion increases the sensed area of the supporting sub-strips when the supporting sub-strips are transferred to the alignment base by sensing during fabrication, and the second preset region is a region of each of the supporting sub-strips which corresponds to a preset sensing region during transferring the supporting strips.

In one or more embodiments, the first sensing portion has a strip-shape, and is perpendicularly fixed to the shielding sub-strips; and the second sensing portion has a strip-shape, and is perpendicularly fixed to the supporting sub-strips.

In one or more embodiments, the shielding strips having a width in a direction perpendicular to the first direction which is smaller than a third preset value are used as shielding sub-strips, and each of the shielding sub-strips is provided with two first supporting portions in third preset region which are spaced apart and perpendicular to the shielding sub-strips; and in case the shielding sub-strips are placed in first alignment grooves which are used for alignment, the third preset region of the shielding sub-strips are located in the first alignment grooves, and an end of each of the two first supporting portions contacts a groove side of the first alignment grooves, so that when the shielding sub-strips are placed in the first alignment grooves, an end portion of each of the shielding sub-strips is located in a preset sensing region.

In one or more embodiments, the supporting strips—each of which has a width in the first direction smaller than a fourth preset value—are used as supporting sub-strips, and each of the supporting sub-strips is further provided with two second supporting portions in fourth preset region which are spaced apart and perpendicular to the supporting sub-strips; in case the supporting sub-strips are placed in second alignment grooves which are used for alignment, the fourth preset region of the supporting sub-strips are located in the second alignment grooves, an end of each of the two second supporting portions contacts a groove side of the second alignment grooves, so that when the supporting sub-strips are placed in the second alignment grooves, an end portion of the supporting sub-strips is located in a preset sensing region.

Embodiments of the present disclosure further provide a method for fabricating the mask plate in embodiments of the present disclosure, the method comprises:

forming a first location hole at both ends of each of the shielding strips in its extending direction, wherein the shielding strips comprises a first border parallel with the first direction, and distances between centers of the first location holes of each of the shielding strips and the first border of the shielding strips lie in a first threshold range;

placing the shielding strips on an alignment base, and in a field of view of an image sensor, placing the shielding strips in a preset position by means of the first location holes;

stretching the shielding strips and transferring the shielding strips onto a frame for soldering; and soldering the mask strips which are provided with plurality of openings onto the frame, wherein the mask strips have a same extending direction as that of the shielding strips, and the shielding strips are located in space between neighboring mask strips.

In one or more embodiments, prior to placing the shielding strips on an alignment base, the method further comprises: placing the shielding strips in first alignment grooves which are arranged in a bearing platform, and setting the shielding strips to have an extending direction parallel with that of the first alignment grooves; and the step of placing the shielding strips on an alignment base comprises: transferring the shielding strips which are placed in the first alignment grooves onto the alignment base, when the shielding strips are detected in a preset sensing region by a sensing component.

In one or more embodiments, the shielding strips having a width in a direction perpendicular to the first direction which is smaller than a third preset value are used as shielding sub-strips;

prior to placing the shielding sub-strips in the first alignment grooves which are arranged in the bearing platform, the method further comprises: arranging a first sensing portion for expanding the sensed area in the first preset region of each of the shielding sub-strips; and transferring the shielding strips which are placed in the first alignment grooves onto the alignment base, when the shielding strips are detected in a preset sensing region by the sensing component, comprises: transferring the shielding sub-strips which are placed in the first alignment grooves onto the alignment base, when the first sensing portion of the shielding sub-strips is detected in the preset sensing region by the sensing component.

In one or more embodiments, the shielding strips having a width in a direction perpendicular to the first direction which is smaller than a third preset value are used as shielding sub-strips;

prior to placing a plurality of the shielding sub-strips in the first alignment grooves which are arranged in the bearing platform, the method further comprises: arranging two first supporting portions in third preset region of the shielding sub-strips which are spaced apart and perpendicular to the shielding strips;

placing the shielding strips in the first alignment grooves which are arranged in a bearing platform, and setting the shielding strips to have an extending direction parallel with that of the first alignment grooves comprise: bringing an end of each of the two first supporting portions to contact a groove side of the first alignment grooves, so that the shielding sub-strips have an extending direction which is parallel with that of the first alignment grooves, and an end portion of each of the shielding sub-strips is located in the preset sensing region; and transferring the shielding strips which are placed in the first alignment grooves onto the alignment base, when the shielding strips are detected in a preset sensing region by a sensing component comprises: transferring the shielding sub-strips which are placed in the first alignment grooves onto the alignment base, when an end portion of each of the shielding sub-strips is detected by the sensing component in the preset sensing region.

In one or more embodiments, the mask plate further comprises auxiliary shielding strips parallel with the shielding strips, the auxiliary shielding strips comprises: shielding strip body and shielding strip branches at both sides of the shielding strip body, and a first extending portion which is arranged at a side of each of the shielding strip branches away from the shielding strip body, the shielding strip body has a width in a direction perpendicular to the first direction which is larger than a width of the shielding strip branches in a direction perpendicular to the first direction, a width of the first extending portion in a direction perpendicular to the first direction is a first preset width; and during transferring the shielding strips which are placed in the first alignment grooves onto the alignment base, when the shielding strips are detected in the preset sensing region by the sensing component, the method further comprises: transferring the auxiliary shielding strips which are placed in the first alignment grooves onto the alignment base, when the first extending portion of the auxiliary shielding strips is detected by the sensing component in the preset sensing region.

DETAILED DESCRIPTION OF EMBODIMENTS

The present disclosure will be described in detail hereinafter with reference to the accompanying drawings and specific implementations, for purpose of better conveying technical solutions of the present disclosure to the skilled in the art.

During fabricating a fine mask plate, shielding strips are generally firstly placed in alignment grooves on the bearing platform, to ensure the shielding strips are placed substantially in a same direction, which facilitates clipping and fetching in a unified manner. Then, a preset sensing region is radiated with a laser. In case the presence of the shielding strips is detected, the shielding strips are transferred to an alignment base, and the shielding strips are positioned at a preset position of the alignment base by means of location holes in the shielding strips for stretching. Finally, the shielding strips are transferred and soldered to a frame. Supporting strips are fabricated in a same manner. Inventors found that generally there are shielding strips with different widths. When the shielding strips with different widths are transferred from the bearing platform to the alignment base, a clamp is used to clip both sides of the shielding strips to perform an equidistance transferring, while location holes of the shielding strips generally are arranged at middle positions in a direction perpendicular to the extending direction of the shielding strips. During alignment through the location holes by means of an image sensor (Charge-coupled Device, CCD) on the alignment base, a problem occurs in which location holes of the shielding strips with different widths do not lie in a same field of view range of CCD. This requires manually adjusting the alignment base several times, which makes the alignment difficult and time consuming, and affects the fluent operation of automated fabrication of the mask plate.

The present disclosure provides a mask plate and a method for fabricating the same, to simplify the fabricating process of mask plate, reduce fabrication duration, and improve fluent operation of automated fabrication of the mask plate.

Figure 1:
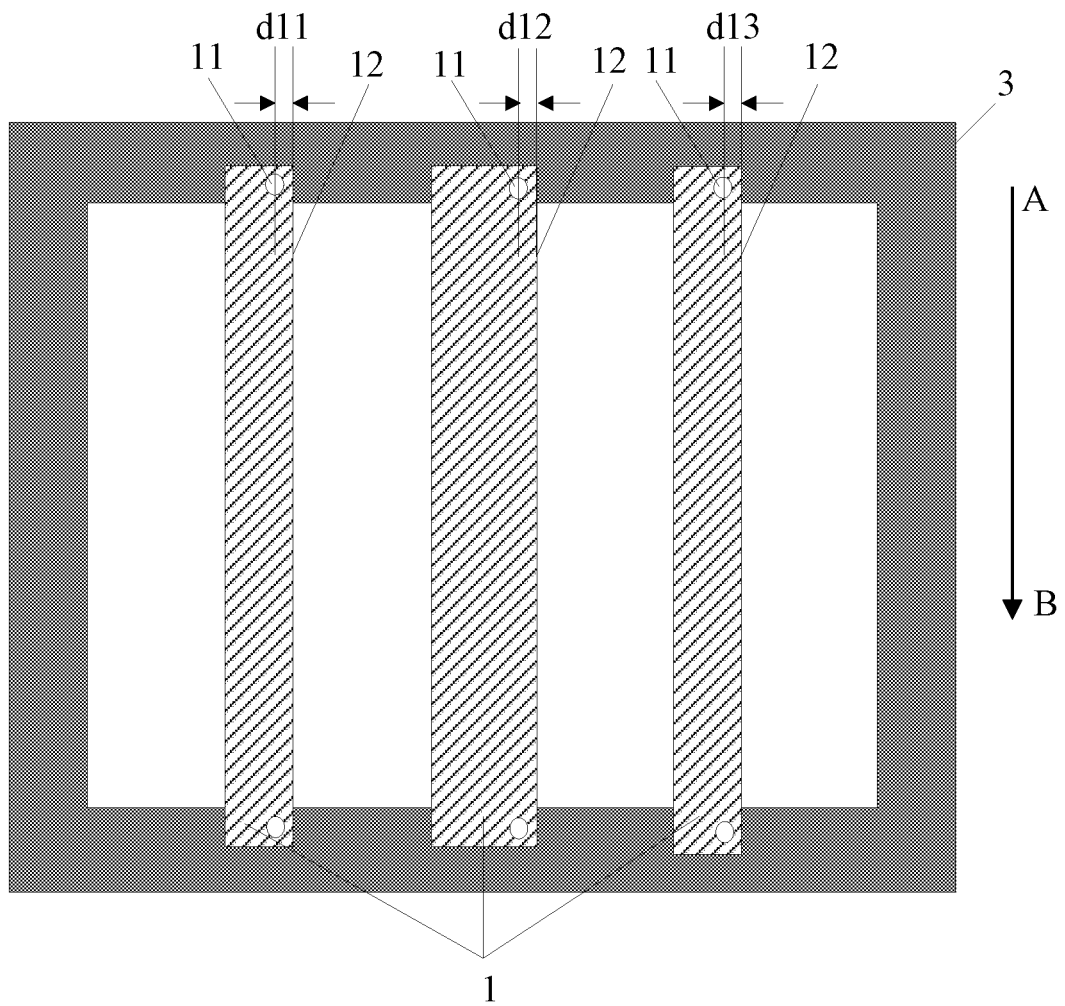
FIG. 1 is a structural view for illustrating a mask plate in an embodiment of the present disclosure.

As shown in FIG. 1, embodiments of the present disclosure provide a mask plate, comprising: a plurality of shielding strips 1 which extend in a first direction (e.g. as shown by an arrow AB). Each of the shielding strips 1 has a first border 12 which is parallel with the first direction, and each of the shielding strips 1 is provided with a first location hole 11 at respective end in its extending direction. Some or all of the shielding strips 1 have widths in a direction perpendicular to the first direction which are different from one another. Distances between centers of the first location holes 11 of each of the shielding strips 1 and the first borders 12 of the shielding strips 1 lie in a first threshold range. Two first location holes 11 of the same shielding strip 1 have a same distance from the first border 12.

Figure 2:
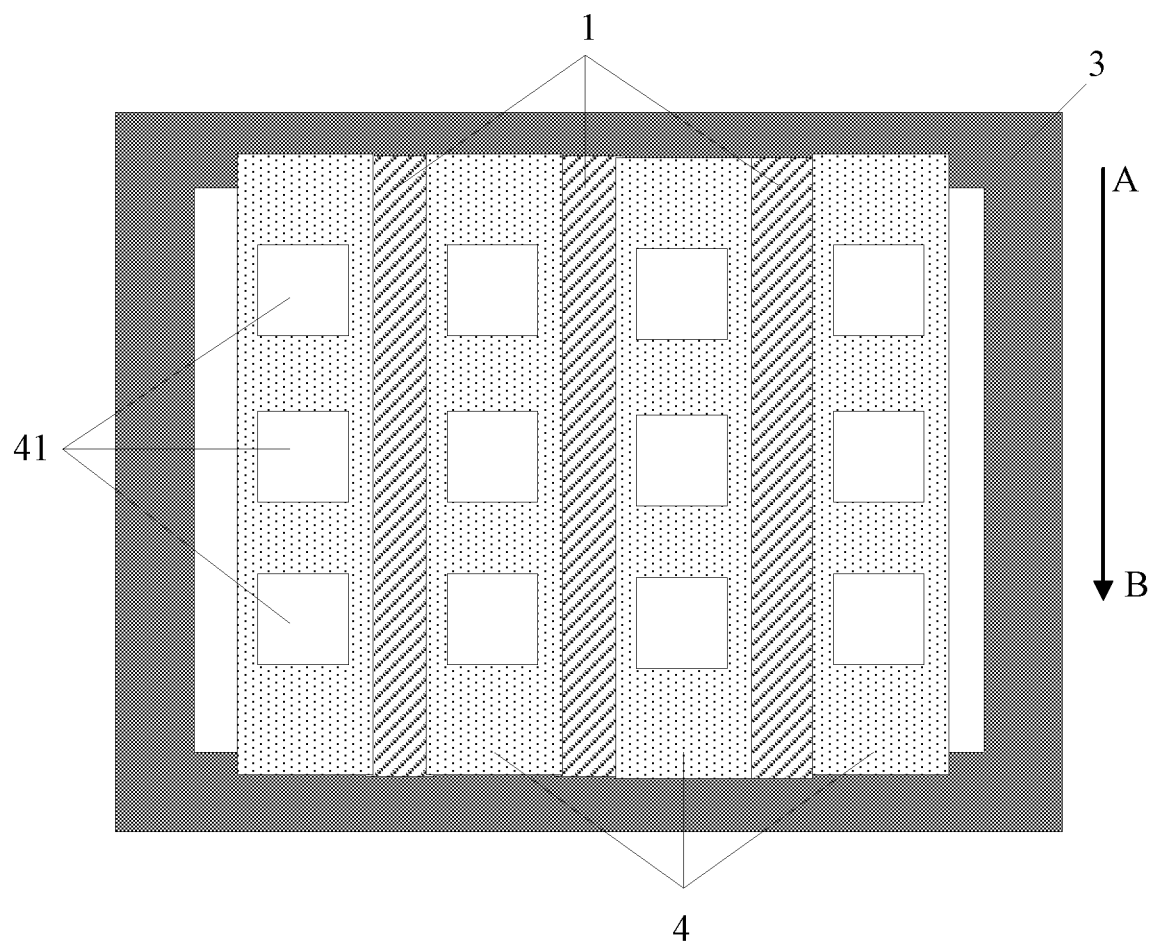
FIG. 2 is an overall structural view for illustrating a mask plate in an embodiment of the present disclosure.

It is noted that, FIG. 1 is used to clearly show positions of the first location holes of the shielding strips in the mask plate, and other components of the mask plate are not shown. In implementations, as for a whole construction, as shown in FIG. 2, the mask plate generally further comprises: a frame 3, which is a hollow ring structure, the plurality of shielding strips 1 which are arranged on the frame 3 and extend in the first direction (e.g. the vertical direction in the figure), and a plurality of mask strips 4 which are arranged on the shielding strips 1 and extend in the first direction (e.g. the vertical direction in the figure). The mask strips 4 are generally provided with a plurality of block-shaped openings 41. In case the mask plate covers a display panel for evaporation, the openings 41 of the mask strips 4 enable to form a light emitting material for pixel units of the display panel. However, the shielding strips 1 of the mask plate generally have a same extending direction as that of the mask strips 4. The shielding strips 1 are arranged in space between neighboring mask strips 4, to shield a gap between neighboring mask strips 4, and thus to prevent the evaporated material from being evaporated on the display panel in a region other than the openings 41 of the mask strips 4. It is noted that, FIG. 2 is used for understanding the overall construction of the mask plate more clearly. Thus a hollow portion is further present between the left-most side mask strip 4 and the frame, and between the right-most side mask strip 4 and the frame. In implementations, apart from openings 41 in the mask strips 4, no hollow portion is present in the mask plate. Furthermore, in the example of FIG. 1 and FIG. 2, the mask plate comprises three shielding strips. In implementations, the number of shielding strips in the mask plate can be set as required, and the present disclosure is not limited in this regard. The first threshold is an interval range, which can specifically be 0.3 mm~0.8 mm. For example, in the mask plate shown in FIG. 1, a distance d11 between the first location holes 11 of the left-most side shielding strip 1 and the first border 12 is 0.4 mm, a distance d12 between the first location holes 11 of a middle shielding strip 1 and the first border 12 is 0.5 mm, and a distance d13 between the first location holes 11 of the right-most side shielding strip 1 and the first border is 0.6 mm. All of the distances d11, d12, d13 are values within the range of 0.3 mm~0.8 mm. Namely, in case all values of d11, d12, d13 lie in the value range, distances between the first location holes of each shielding strip and the first border can be considered as being substantially equal. Thus, in case the shielding strips are placed on the alignment base for positioning, the first location holes of shielding strips with different widths can be brought within the field of view range of the image sensor (CCD). For example, distances between centers of the first location holes of each of the shielding strips and the first border of the shielding strips are a first preset value which is a specific value within the first threshold range.

In implementations, during fabrication of a mask plate, especially a fine mask plate for a high definition organic light emitting display panel, prior to being soldered on the frame of the mask plate, the shielding strips are generally stretched and tightened up. In order to ensure the force applied at both ends during stretching lie in a same line, and to prevent stretching abnormality, it is generally required to place the shielding strips on the alignment base for proper positioning, so that the shielding strips are positioned at a preset position of the alignment base. The process of positioning the shielding strips on the alignment base is performed in the field of view of CCD through movement of the alignment base, so that the first location holes of the shielding strips are aligned with a center of CCD (which is a reference position and remains constant during the positioning process), and thus the shielding strips are arranged at the preset position. During the positioning process in the field of view of CCD by means of the first location holes, due to the fact that the shielding strips have different widths, the following problem arises when all of the first location holes are arranged at a middle position in a direction perpendicular to the extending direction of the shielding strips. After the first location holes of relatively narrow shielding strips are identified under CCD, the first location holes of relatively wide shielding strips are not in the current field of view of CCD, and it is necessary to manually adjustment the alignment base, so that these first location holes are present in the field of view of CCD. In case a plurality of shielding strips with different widths are arranged in the mask plate, this arrangement of the first location holes of the shielding strips undoubtedly increases the fabrication complexity of mask plate, extends the fabrication duration of mask plate, and affects the fluent operation during automated fabrication of mask plate. In embodiments shown in FIGS. 1-2, distances between the first location holes of the shielding strips with different widths and the first border lie in the first threshold range, so that while placing the shielding strips on an alignment base for positioning, it is not necessary to manually adjust the alignment base for several times, so as to fabricate a mask plate comprising shielding strips with different widths. In this way, the positioning of wide and narrow shielding strips is realized. This simplifies the fabricating process of a fine mask plate, reduces the fabrication duration of a fine mask plate, and improves the fluent operation during automated fabrication of mask plate.

Figure 3:
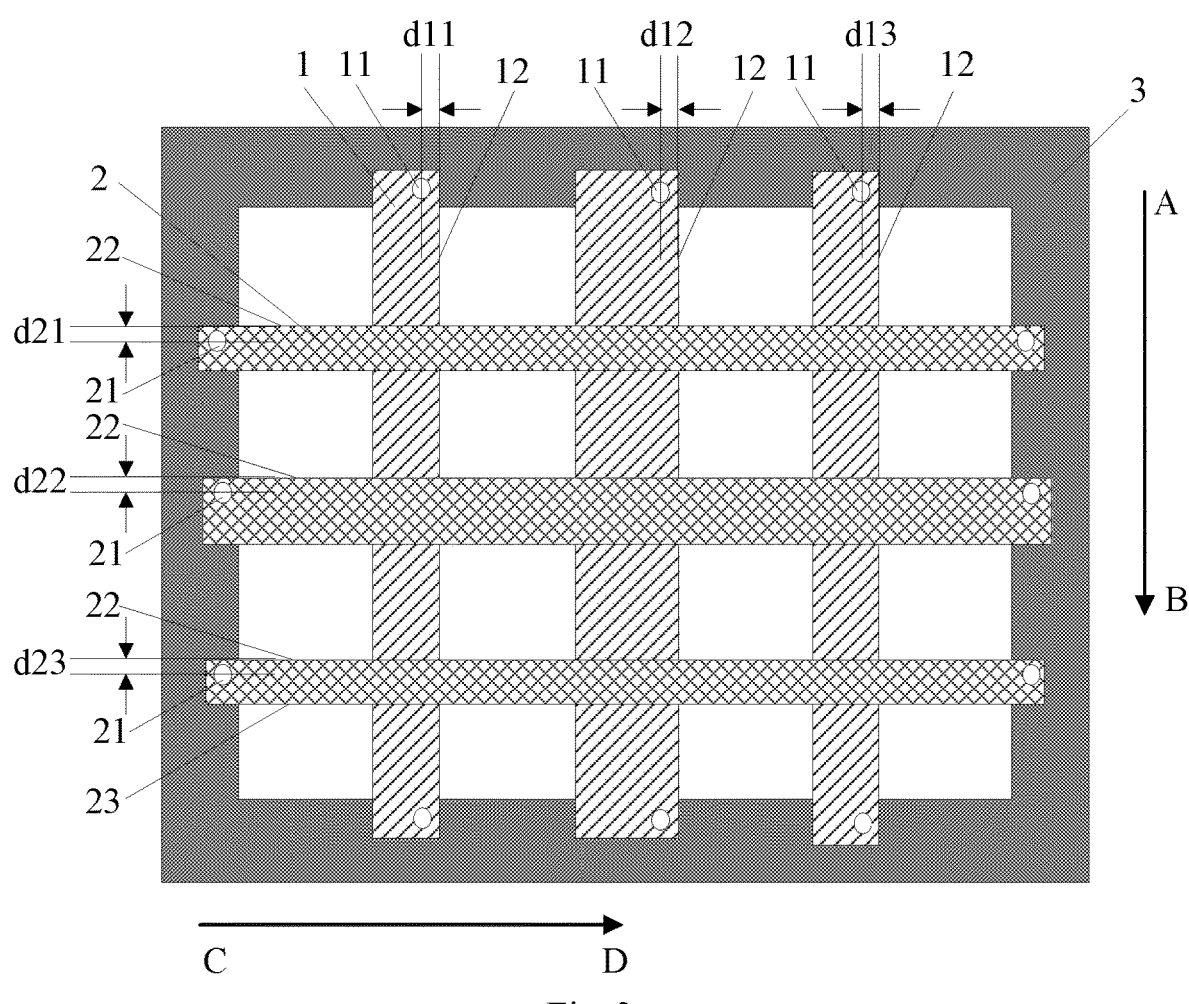
FIG. 3 is a structural view for illustrating a mask plate in an embodiment of the present disclosure.

As shown in FIG. 3, in an embodiment of the present disclosure, the mask plate further comprises a plurality of supporting strips 2 which extend in a second direction (e.g., as shown by an arrow CD). The second direction is perpendicular to the first direction. Each of the supporting strips 2 has a second border 22 which is parallel with the second direction, and each of the supporting strips 2 is provided with a second location hole 21 at both ends of its extending direction. Some or all of the supporting strips 2 have widths in a direction perpendicular to the second direction which are different from one another. Distances between centers of the second location holes 21 of each of the supporting strips 2 and the second border 22 of the supporting strips 2 lie in a second threshold range.

Similar with FIG. 1, FIG. 3 is used to clearly show the second location holes of the supporting strips in the mask plate, and other components of the mask plate are not shown. Reference can be made to FIG. 2 for other components of the mask plate, which are not repeated here for simplicity. The supporting strips 2 are generally arranged above the shielding strips 1 and below the mask strips 4, and extend in a direction perpendicular to the extending direction of the mask strips 4. The supporting strips 2 are used to support relatively thin mask strips 4, so that the mask strips 4 are flat to prevent depression in the mask strips 4. Furthermore, in the embodiment of FIG. 3, the mask plate comprises three supporting strips. In implementations, the number of supporting strips in the mask plate can be set as required, and the present disclosure is not limited in this regard. The second threshold is an interval range, which can specifically be 0.3 mm~0.8 mm. In the mask plate shown in FIG. 3, a distance d21 between the second location holes 21 of the left-most side supporting strip 2 and the second border 22 is 0.4 mm, a distance d22 between the second location holes 21 of a middle supporting strip 2 and the second border 22 is 0.5 mm, and a distance d23 between the second location holes 21 of the right-most side supporting strip 2 and the second border is 0.6 mm. All of the distances d11, d12, d13 are values within the range of 0.3 mm~0.8 mm. Namely, in case of all values of d21, d22, d23 lie in the value range, distances between the second location holes of each shielding strip and the second border can be considered as being substantially equal. Thus, in case the shielding strips are placed on the alignment base for positioning, the second location holes of shielding strips with different widths can be brought within the field of view range of the image sensor (CCD). For example, distances between centers of the second location holes of each of the shielding strips and the second border of the shielding strips are a first preset value which is a specific value within the second threshold range.

Similar with the shielding strips shown in FIGS. 1-2, during fabrication of the supporting strips of a mask plate, prior to being soldered on the frame of the mask plate, the shielding strips are generally stretched and tightened up. In order to ensure the force applied at both ends during stretching lie in a same line, and to prevent stretching abnormality, it is generally required to place the shielding strips on the alignment base for proper positioning, so that the shielding strips are positioned at a preset position of the alignment base. The process of positioning the shielding strips on the alignment base is performed in the field of view of CCD through movement of the alignment base, so that the second location holes of the shielding strips are aligned with the center of CCD (which is a reference position and remains constant during the positioning process), and thus the shielding strips are arranged at the preset position. During the positioning process in the field of view of CCD by means of the second location holes, due to the fact that the shielding strips have different widths, the following problem arises when all of the second location holes are arranged at a middle position in a direction perpendicular to the extending direction of the shielding strips. After the second location holes of relatively narrow shielding strips are identified under CCD, the second location holes of relatively wide shielding strips are not in the current field of view of CCD, and it is necessary to manually adjustment the alignment base, so that these second location holes are present in the field of view of CCD. In case a plurality of shielding strips with different widths are arranged in the mask plate, this arrangement of the second location holes of the shielding strips undoubtedly increases the fabrication complexity of mask plate, extends the fabrication duration of mask plate, and affects the fluent operation during automated fabrication of mask plate. In embodiments shown in FIG. 3, distances between the second location holes of the shielding strips with different widths and the second border lie in the second threshold range, so that during placing the shielding strips on an alignment base for positioning, it is not necessary to manually adjust the alignment base for several times, so as to fabricate a mask plate comprising shielding strips with different widths. In this way, the positioning of wide and narrow shielding strips is realized. This simplifies the fabricating process of a fine mask plate, reduces the fabrication duration of a fine mask plate, and improves the fluent operation during automated fabrication of mask plate.

Figure 4:
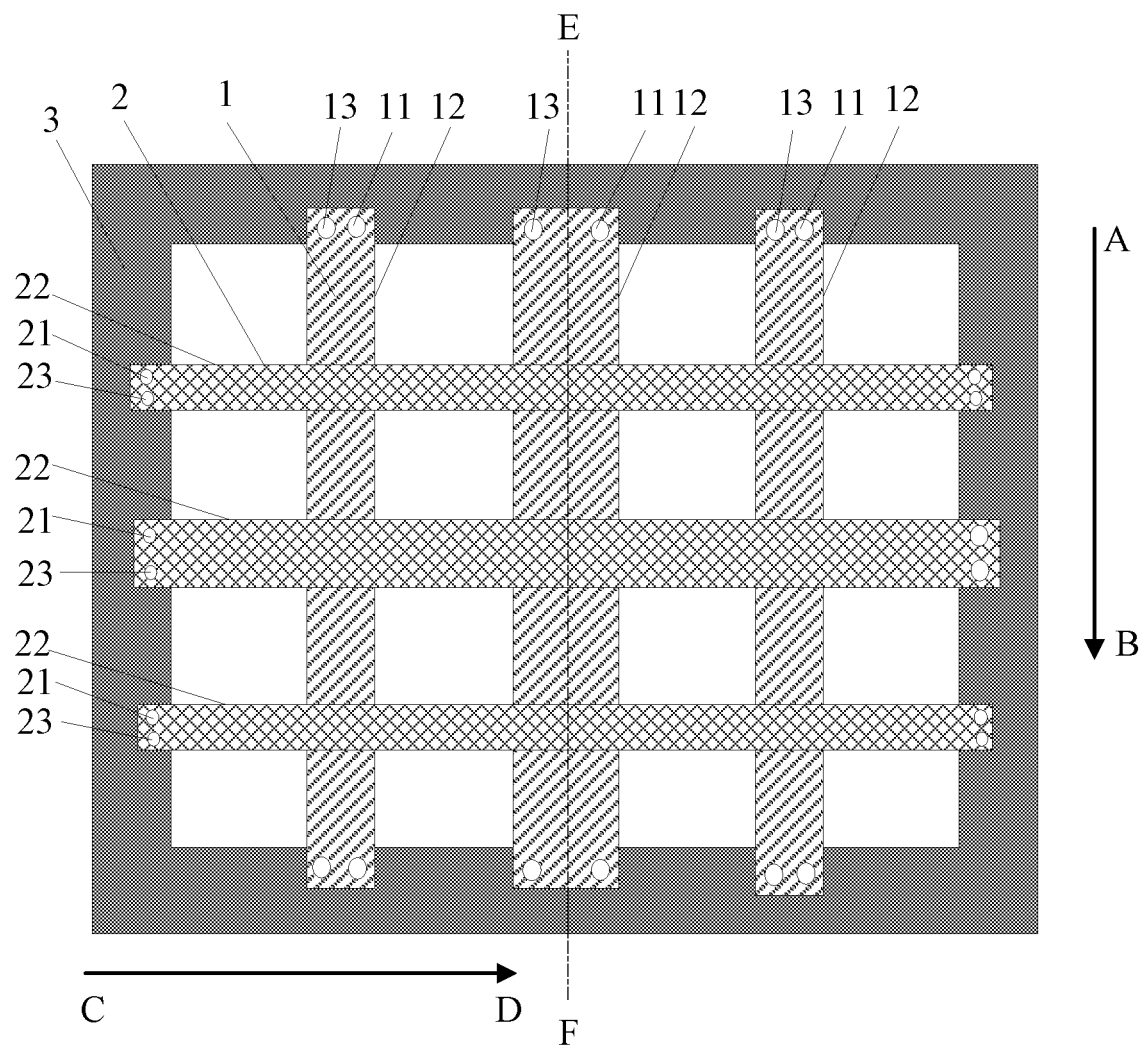
FIG. 4 is a structural view for illustrating a mask plate in an embodiment of the present disclosure.

As shown in FIG. 4, an embodiment of the present disclosure provides a mask plate, in which each of the shielding strips 1 is further provided with a third location hole 13 at both ends of its extending direction, and the third location hole 13 and the first location hole 11 at a same end are symmetrical with respect to a central axis of the shielding strips 1 which is parallel with the first direction. For example, by taking the first location holes 11 and third location hole 13 of the middle shielding strip 1 in FIG. 4 as an example, the third location hole 13 and the first location hole 11 at the upper end are symmetrical with respect to a central axis EF of the shielding strip 1 which is parallel with the first direction.

As for supporting strips 2, each of the supporting strips 2 is further provided with a fourth location hole 23 at both ends of its extending direction, and the fourth location hole 23 and the second location hole 21 at a same end are symmetrical with respect to a central axis (not shown) of the supporting strip 2 which his parallel with the second direction.

In the embodiment FIG. 4, since the shielding strips and/or supporting strips are generally stretched after being positioned on the alignment base, and then soldered on the frame, due to the arrangement of the third location holes being symmetrical with respect to the first location holes and the fourth location holes being symmetrical with respect to the second location holes, it is ensured that balanced force is applied to each position of the shielding strips or supporting strips during stretching. This avoids stretching abnormality due to unbalanced force during stretching, which would otherwise occurs if the first location holes are arranged at only one side.

Figure 5:
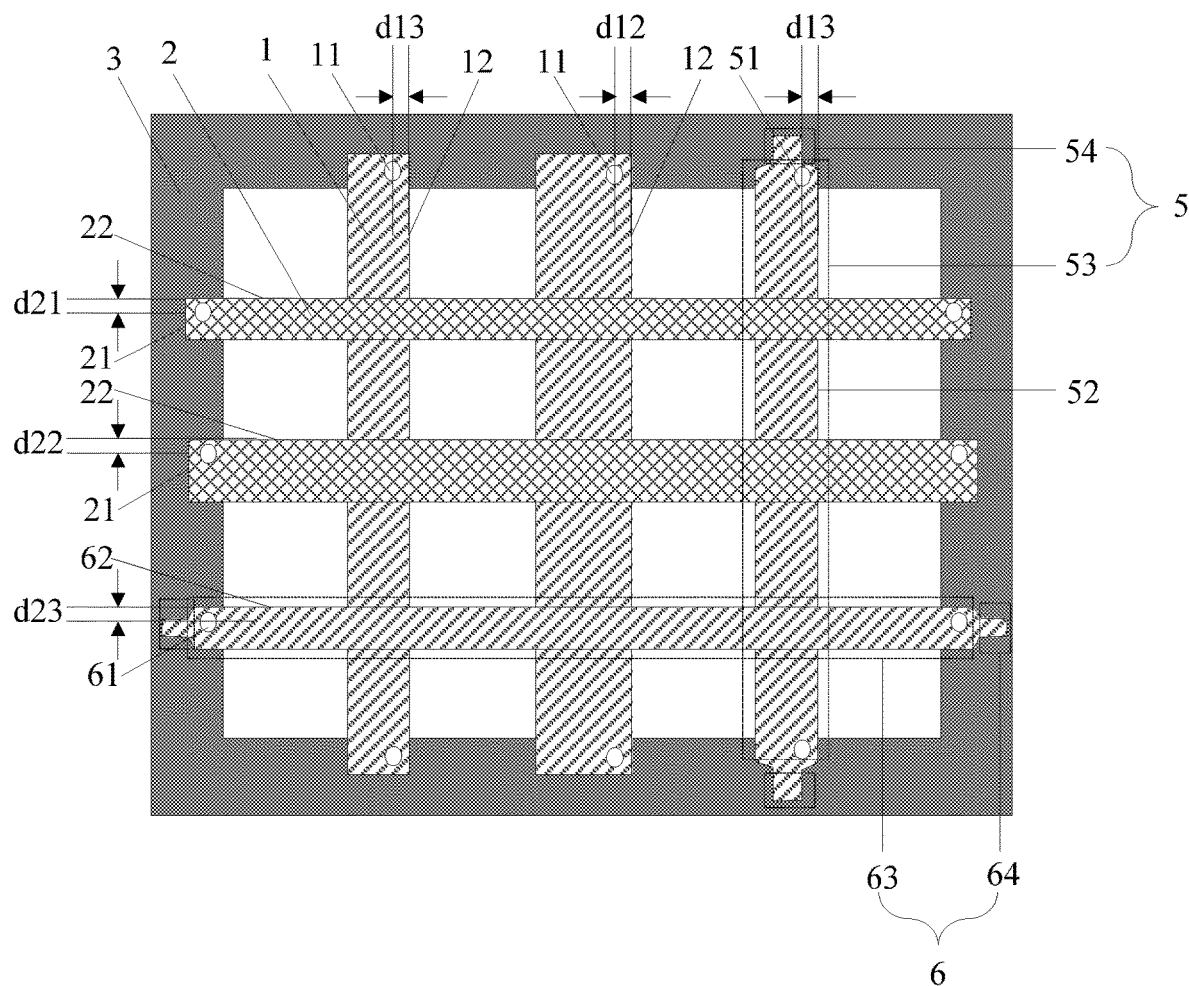
FIG. 5 is a structural view for illustrating a mask plate in an embodiment of the present disclosure.

As shown in FIG. 5, embodiments of the present disclosure provide a mask plate. The mask plate further comprises auxiliary shielding strips 5 which are arranged in a same layer as and are parallel with the shielding strips 1. Each of the auxiliary shielding strips 5 comprises: a shielding strip body 53 and shielding strip branches 54 at both sides of the shielding strip body 53. The shielding strip body 53 has a width in a direction perpendicular to the first direction which is larger than a width of the shielding strip branches 54 in a direction perpendicular to the first direction. The shielding strip body 53 has a first auxiliary border 52 which is parallel with the first direction, and each of the shielding strips bodies 53 is provided with a first auxiliary location hole 51 at both ends of its extending direction. Distances between centers of the first auxiliary location holes 51 of each of the auxiliary shielding strips 5 and the first auxiliary border 52 of the auxiliary shielding strips 5 lie in the first threshold range.

The mask plate further comprises auxiliary supporting strips 6 which are arranged in a same layer as and are parallel with the supporting strips 2. Each of the auxiliary supporting strips 6 comprises: a supporting strip body 63 and supporting strip branches 64 at both sides of the supporting strip body 63. The supporting strip body 63 has a width in a direction perpendicular to the second direction which is larger than a width of each of the supporting strip branches 64 in a direction perpendicular to the second direction. The supporting strip body 63 has a second auxiliary border 62 which is parallel with the second direction, and each of the supporting strip bodies 63 is provided with a second auxiliary location hole 61 at both ends of its extending direction. Distances between centers of the second auxiliary location holes 61 of each of the auxiliary supporting strips 6 and the second auxiliary border 62 of the auxiliary supporting strips 6 lie in a second threshold range.

In implementations, the mask plate not only comprises shielding strips or supporting strips which have a same width in a direction perpendicular to the extending direction (namely, a shielding component of an integrated rectangular structure), but also comprises auxiliary shielding strips or auxiliary supporting strips which have different widths in a direction perpendicular to the extending direction. In existing auxiliary shielding strips, the first location holes are generally arranged at middle positions of the shielding strip branches in the vertical direction. As a result, the existing auxiliary shielding strips also suffer from the problem in which it is difficult to locate the first location holes in the field of view of CCD during alignment. The auxiliary supporting strips surfer from the same problem. In the embodiment shown in FIG. 5, the first location holes are arranged in the shielding strip body, and distances between centers of the first auxiliary location holes of each of the auxiliary shielding strips and the first auxiliary border of the auxiliary shielding strips lie in the first threshold range. As a result, in case distances between the location holes of different types of shielding strips and the border lie in the first threshold range, during fabricating a mask plate and placing the shielding strips on an alignment base for positioning, it is not necessary to manually adjust the alignment base for several times, and the positioning of different types of shielding strips is realized. This simplifies the fabricating process and reduces the fabrication duration of the fine mask plate.

Figure 6:
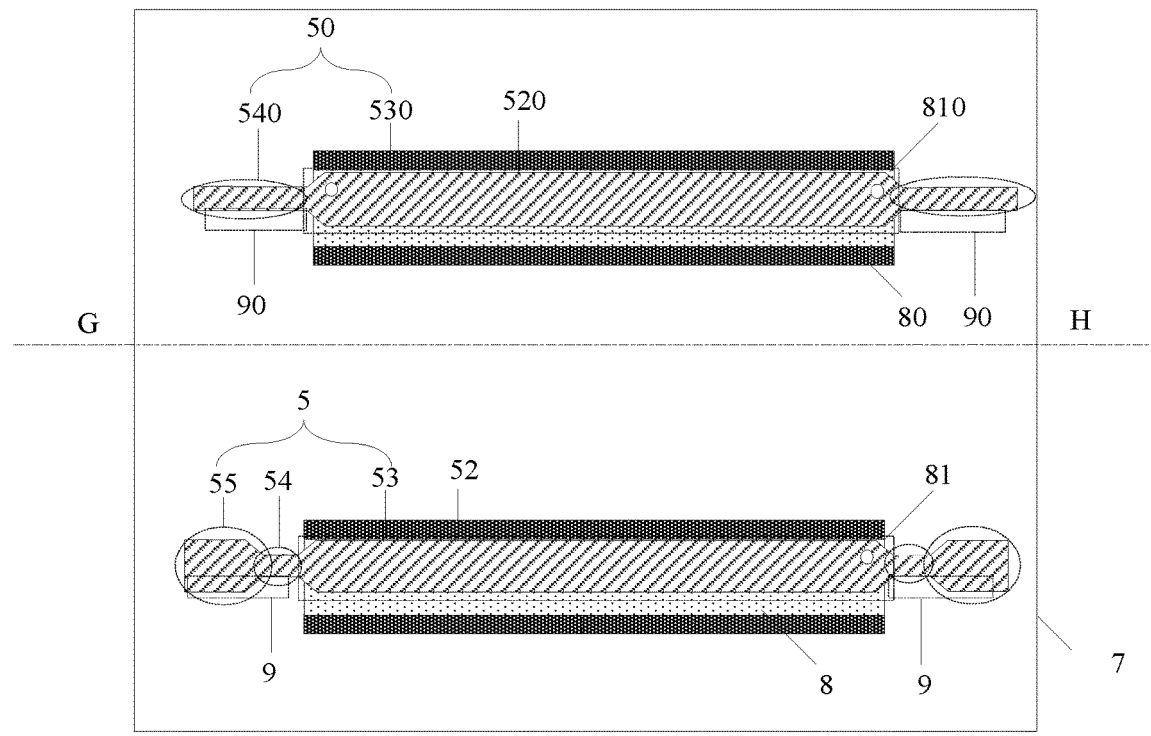
FIG. 6 is a schematic view for illustrating a comparison between an existing mask plate and a mask plate in an embodiment of the present disclosure.

As shown in FIG. 6, in one or more embodiments, each of the auxiliary shielding strips 5 further comprises: a first extending portion 55 which is arranged at a side of each of the shielding strip branches 54 away from the shielding strip body 53. The first extending portion 55 has width in a direction perpendicular to the first direction which is a first preset width. The first extending portion 55 is used to increase the sensed area of the shielding strips 5.

Similarly, each of the auxiliary supporting strips further comprises a second extending portion (not shown) which is arranged at a side of each of the supporting strip branches away from supporting strip body. The second extending portion has a width in a direction perpendicular to the second direction which is a second preset width. The second extending portion is used to increase the sensed area of the supporting strips.

It is noted that, FIG. 6 is used to clearly show the function of the first extending portion of the auxiliary shielding strips. This function is explained in a scenario where the auxiliary shielding strips are placed in the first alignment grooves on the bearing platform 7 during fabrication. A structural view for the existing auxiliary shielding strips 50 which are placed in the first alignment grooves 80 is shown above the dashed line GH, and a structural view for the auxiliary shielding strips 5 in embodiments of the present disclosure which are placed in the first alignment grooves 8 is shown below the dashed line GH. In the fabricating process of the existing auxiliary shielding strips 50, prior to being placed on the alignment base for alignment, the auxiliary shielding strips 50 generally are placed in the first alignment grooves 80 on the bearing platform 7, so that the auxiliary shielding strips 50 substantially lie in a horizontal position, which facilitates transferring in an automated flow manner. When the auxiliary shielding strips 50 are placed in the first alignment grooves 80, the first auxiliary border of the shielding strip body 530 of the auxiliary shielding strips 50 is generally flush with a groove side of the first alignment grooves 80 (as shown by an upper border 810 in FIG. 6), to ensure that the auxiliary shielding strips 50 can substantially lie in a horizontal position. Prior to transferring, it is detected by a laser whether the auxiliary shielding strips are present in the preset sensing region, and if yes, the auxiliary shielding strips are picked up and transferred. The preset sensing region is generally arranged at a specific region outside both end portions of the alignment grooves (e.g. as shown by a dashed line box 90), and the detected laser has a spot of a limited size. The shielding strip branches 540 of the auxiliary shielding strips 50 have a relatively small width. In case it is detected that no auxiliary shielding strip is present in the preset sensing region, the auxiliary shielding strips cannot be picked up and transferred, which extends the fabricate duration of the mask plate. In contrast, in the embodiment FIG. 6, the auxiliary shielding strips 5 are improved. Namely, the first extending portion 55 is arranged at a side of each of the shielding strip branches 54 away from the shielding strip body 53, and has a width in a direction perpendicular to its extending direction which is the first preset width. In this way, after the auxiliary shielding strips 5 are aligned with the first alignment grooves 8, the auxiliary shielding strips 5 in a preset sensing region 9 can rapidly be detected, and then transferred to the alignment base for alignment. This can simplify the fabricating process and reduce the duration of the mask plate. The first preset width can be set as required.

Figure 7:
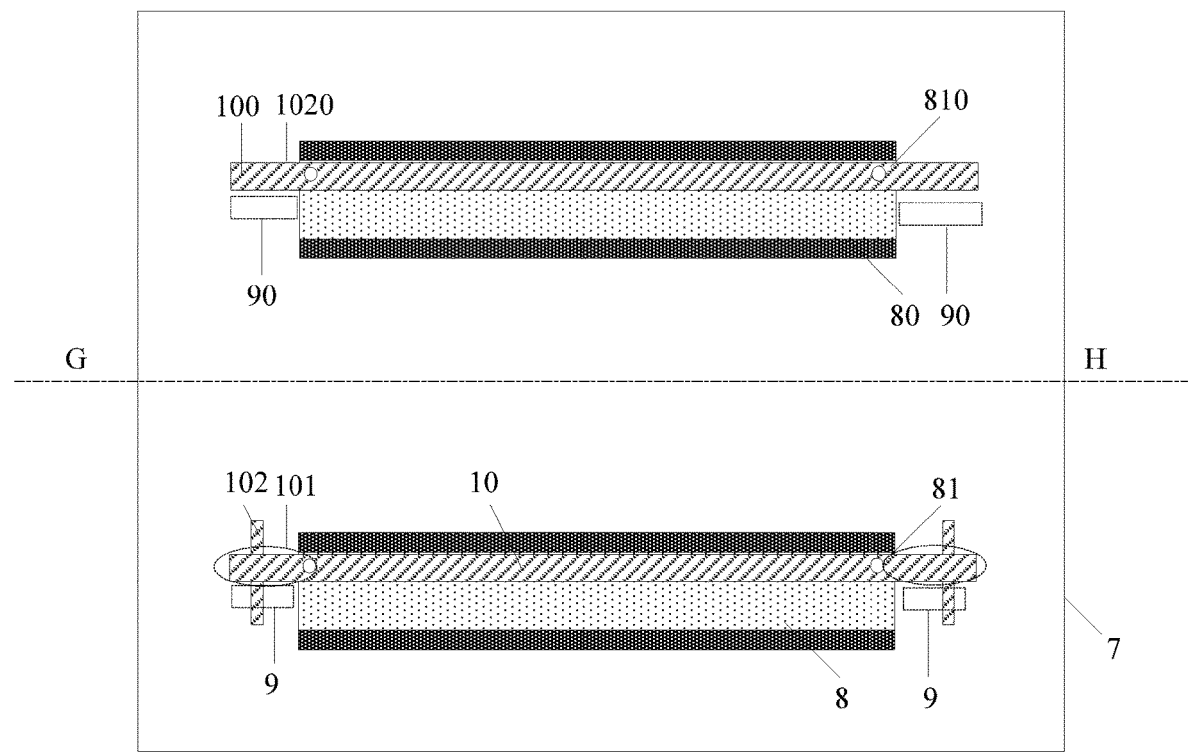
FIG. 7 is a schematic view for illustrating a comparison between an existing mask plate and a mask plate in an embodiment of the present disclosure.

As shown in FIG. 1 and FIG. 7, the shielding strips having a width in a direction perpendicular to the first direction which is smaller than a third preset value are used as shielding sub-strips 10. For example, the left-most side shielding strip in FIG. 1 is a shielding sub-strip. Each of the shielding sub-strips 10 is further provided with a first sensing portion 102 in a first preset region 101 which is used to expand the sensed area. The first preset region 101 is a region of the shielding sub-strip 10 which corresponds to the preset sensing region 9 during transferring the shielding strips 10. The first preset region 101 can be determined according to the position where the shielding sub-strips 10 are placed during transferring and the position where the laser is irradiated.

The supporting strips have a width in a direction perpendicular to the second direction which is smaller than a fourth preset value are used as supporting sub-strips. Each of the supporting sub-strips is further provided with a second sensing portion in a second preset region which is used to expand the sensed area. The second preset region is a region of the supporting sub-strips which corresponds to the preset sensing region during transferring the supporting strips.

Similar with FIG. 6, FIG. 7 is used to clearly show the function of the first sensing portion of the shielding sub-strips. This function is explained in a scenario where the shielding strips are placed in the first alignment grooves during fabrication. A structural view for the existing shielding sub-strips 100 which are placed in the first alignment grooves 80 is shown above the dashed line GH, and a structural view for the shielding sub-strips 10 in embodiments of the present disclosure which are placed in the first alignment grooves 8 is shown below the dashed line GH. During fabricating the mask plate, prior to being placed on the alignment base for alignment, the shielding sub-strips 100 generally are placed in the first alignment grooves 80 on the bearing platform, so that the shielding sub-strips 100 substantially lie in a horizontal position, which facilitates transferring in an automated flow manner. When the shielding sub-strips 100 are placed in the first alignment grooves, the first border 1020 of the shielding sub-strips 100 is generally flush with a groove side of the first alignment grooves 80 (as shown by the upper border 810 in FIG. 7), to ensure that the shielding sub-strips 100 can substantially lie in a horizontal position. Prior to transferring, it is detected by a laser whether the shielding sub-strips are present in the preset sensing region, and if yes, the shielding sub-strips are picked up and transferred. The preset sensing region is generally arranged at a specific region outside both end portions of the first alignment grooves (e.g. as shown by a dashed line box 90), and the detected laser has a spot of a limited size. As for the shielding sub-strips 100 with a relatively narrow width, when no shielding sub-strip 100 is detected in the preset region, the shielding sub-strips cannot be picked up and transferred, which extends the fabricate duration of the mask plate. In the embodiment FIG. 6, the shielding sub-strips 10 are improved. Namely, the first sensing portion 102 for expanding the sensed area is further provided in the first preset region 101 of each of the shielding sub-strips 10. In this way, after the shielding sub-strips 10 are aligned with the first alignment grooves, the shielding sub-strips 10 in the sensing region are rapidly detected, and then transferred to the alignment base for alignment. This can simplify the fabricating process and reduce the duration of the mask plate.

For example, the first sensing portion has a strip-shape, and is fixed in a direction perpendicular to the shielding sub-strips; and the second sensing portion has a strip-shape, and is fixed in a direction perpendicular to the shielding sub-strips.

Figure 8:
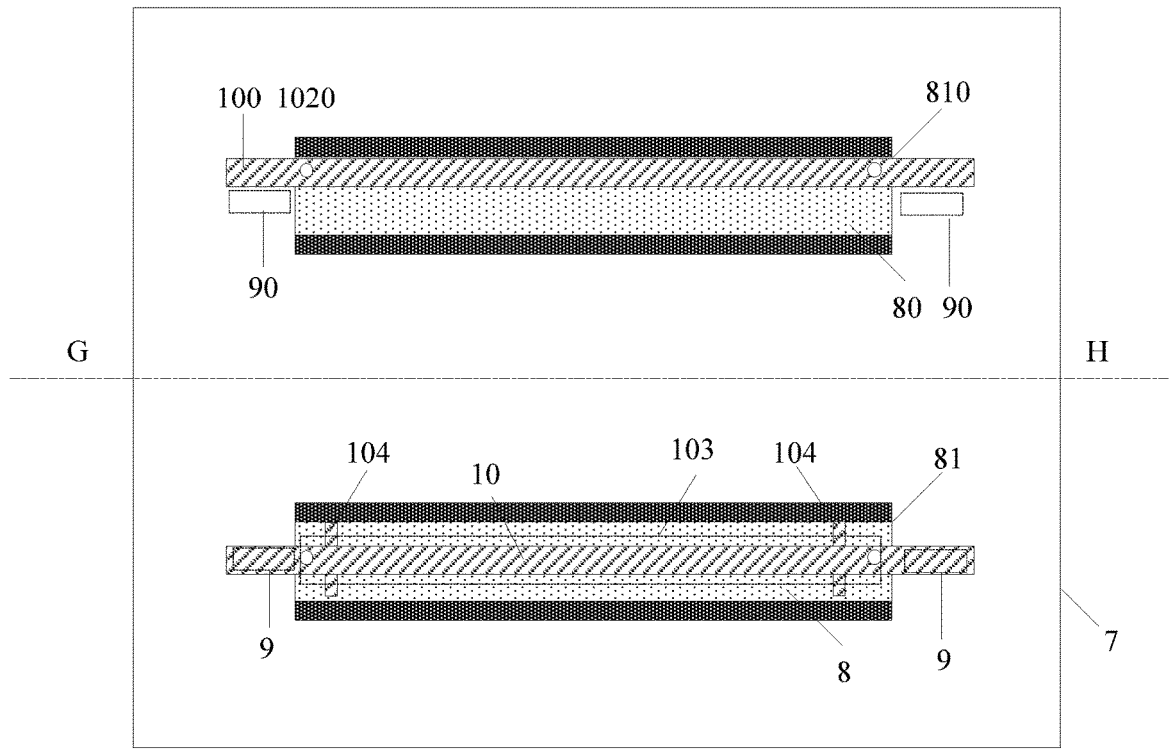
FIG. 8 is a schematic view for illustrating a comparison between an existing mask plate and a mask plate in an embodiment of the present disclosure.

As shown in FIG. 8, the shielding strips having a width in a direction perpendicular to the first direction which is smaller than the third preset value are used as shielding sub-strips 10. The shielding sub-strips 10 is provided with two first supporting portions 104 in a third preset region 103 which are spaced apart and perpendicular to the shielding sub-strips. In case the shielding sub-strips 10 are placed in the first alignment grooves for alignment, the third preset region 103 of the shielding sub-strips 10 is placed in the first alignment grooves, and an end of the two first supporting portions 104 contacts a groove side (e.g. an upper groove side 81 in the figure) of the first alignment grooves. As a result, when the shielding sub-strips 10 are placed in the first alignment grooves 8 and it is ensured that the shielding sub-strips 10 substantially lie in a horizontal position, the end portion of the shielding sub-strips 10 is located in the preset sensing region 9.

The supporting strips having a width in a direction perpendicular to the second direction which is smaller than a fourth preset value are used as the supporting sub-strips. Each of the supporting sub-strips is further provided with two second supporting portions in a fourth preset region which are spaced apart and perpendicular to the supporting sub-strips. In case the supporting sub-strips are placed in the second alignment grooves for alignment, the fourth region of each of the supporting sub-strips is placed in the second alignment grooves, and an end of the two second supporting portions contacts a groove side of the second alignment grooves. As a result, when the supporting sub-strips are placed in the second alignment grooves and it is ensured that the supporting sub-strips substantially lie in a horizontal position, the end portion of the supporting sub-strips is located in a preset sensing region.

The shielding sub-strips 10 have a length in the extending direction which is larger than the length of the first alignment grooves 8. Namely, the first alignment grooves 8 cannot completely bear the shielding sub-strips 10. Portion shielding sub-strips for picking up are further arranged outside both ends of the first alignment grooves 10. The two first supporting portions 104 are arranged in the third preset region 103 of the shielding sub-strips 10 within the first alignment grooves 8. By arranging positions of the two first supporting portions 104 and the first alignment grooves 8, a portion of a relatively narrow shielding sub-strip 10 outside the first alignment grooves 8 can be located in the preset sensing region, thus detected by the respective sensing component, and transferred by the respective transfer component. In the embodiment shown in FIG. 8, the shielding sub-strips is provided with two first supporting portions in a third preset region which are spaced apart and perpendicular to the shielding sub-strips. In case the shielding sub-strips are placed in the first alignment grooves for alignment, the third preset region of the shielding sub-strips is located in the first alignment grooves, and an end of the two first supporting portions contacts a groove side of the first alignment grooves, so that when the shielding sub-strips are placed in the first alignment grooves, an end portion of the shielding sub-strips is located in the sensing region. In this way, after the shielding sub-strips are aligned with the first alignment grooves, the shielding sub-strips in the sensing region can be rapidly detected, and then transferred to the alignment base for alignment. This can simplify the fabricating process and reduce the duration of the mask plate.

Figure 9:
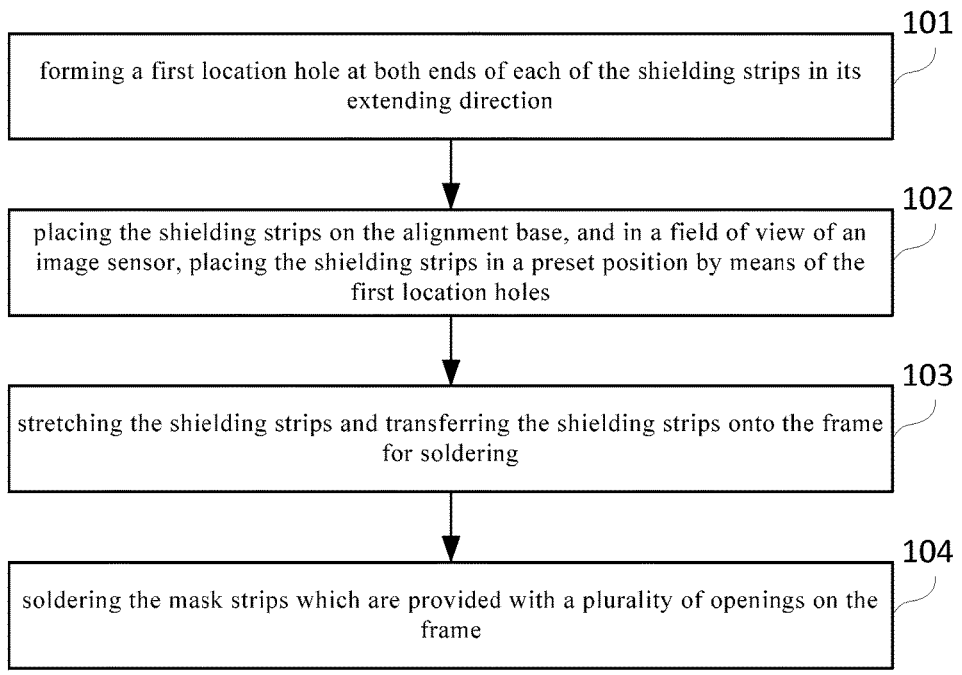
FIG. 9 is a schematic view for illustrating a fabricating process of a mask plate in an embodiment of the present disclosure.

As shown in FIG. 9, embodiments of the present disclosure further provide a method for fabricating a mask plate in embodiments of the present disclosure. The method comprises the following steps.

Step 101, forming a first location hole at both ends of each of the shielding strips in its extending direction, wherein the shielding strips comprise a first border parallel with the first direction, and distances between centers of the first location holes of the shielding strips and the first border of the shielding strips lie in the first threshold range.

Step 102, placing the shielding strips on the alignment base, and in a field of view of an image sensor, placing the shielding strips in a preset position by means of the first location holes.

For example, prior to placing the shielding strips in the alignment base, the method further comprises: placing the shielding strips in the first alignment grooves which are arranged in a bearing platform, and setting the shielding strips to have an extending direction parallel with that of the first alignment grooves. Further, placing the shielding strips in the first alignment grooves accordingly comprises: transferring the shielding strips which are placed in the first alignment grooves onto the alignment base, when the shielding strips are detected in a preset sensing region by a sensing component. Of course, in an automated process for fabricating a mask plate, a sensing component can further be provided.

In implementations, in order to rapidly transfer different types of shielding strips, as for the shielding sub-strips having a width in a direction perpendicular to the first direction which is smaller than the third preset value, a first sensing portion can be provided in a first preset region to expand the sensed area. Alternatively, two first supporting portions can be provided in a third preset region, so that an end portion of the shielding sub-strips are placed in the sensing region. Alternatively, as for auxiliary shielding strips, a first extending portion having a width in the first direction which is a first preset width can be provided, so as to expand the sensed area. Steps for transferring different shielding strips will be described hereinafter by specific examples.

In an example, the shielding strips having a width in a direction perpendicular to the first direction which is smaller than the third preset value are used as shielding sub-strips. Prior to placing the shielding sub-strips in the first alignment grooves which are arranged in the bearing platform, the method further comprises: arranging a first sensing portion for expanding the sensed area in the first preset region of each of the shielding sub-strips. Transferring the shielding strips which are placed in the first alignment grooves onto the alignment base, when the shielding strips are detected in a preset sensing region by the sensing component, comprises: transferring the shielding sub-strips which are placed in the first alignment grooves onto the alignment base, when the first sensing portion of the shielding sub-strips is detected in the preset sensing region by the sensing component.

In another example, the shielding strips having a width in a direction perpendicular to the first direction which is smaller than a third preset value are used as shielding sub-strips. Prior to placing a plurality of the shielding sub-strips in the first alignment grooves which are arranged in the bearing platform, the method further comprises: arranging two first supporting portions in third preset region of the shielding sub-strips which are spaced apart and perpendicular to the shielding strips. Placing the shielding strips in first alignment grooves which are arranged in a bearing platform, and setting the shielding strips to have an extending direction parallel with that of the first alignment grooves comprise: bringing an end of each of the two first supporting portions to contact a groove side of the first alignment grooves, so that the shielding sub-strips have an extending direction which is parallel with that of the first alignment grooves, and an end portion of each of the shielding sub-strips is located in the preset sensing region. Transferring the shielding strips which are placed in the first alignment grooves onto the alignment base, when the shielding strips are detected in a preset sensing region by a sensing component comprises: transferring the shielding sub-strips which are placed in the first alignment grooves onto the alignment base, when an end portion of each of the shielding sub-strips is detected by the sensing component in the preset sensing region.

In yet another example, the mask plate further comprises auxiliary shielding strips parallel with the shielding strips. The auxiliary shielding strips comprises: shielding strip body and shielding strip branches at both sides of the shielding strip body, and a first extending portion which is arranged at a side of each of the shielding strip branches away from the shielding strip body, the shielding strip body has a width in a direction perpendicular to the first direction which is larger than a width of the shielding strip branches in a direction perpendicular to the first direction, a width of the first extending portion in a direction perpendicular to the first direction is a first preset width. During transferring the shielding strips which are placed in the first alignment grooves onto the alignment base, when the shielding strips are detected in the preset sensing region by the sensing component, the method further comprises: transferring the auxiliary shielding strips which are placed in the first alignment grooves onto the alignment base, when the first extending portion of the auxiliary shielding strips is detected by the sensing component in the preset sensing region.

Step 103, stretching the shielding strips and transferring the shielding strips onto the frame for soldering.

Step 104, soldering the mask strips which are provided with a plurality of openings on the frame, wherein the mask strips have a same extending direction as that of the shielding strips, and the shielding strips are located in space between neighboring mask strips.

Figure 10:
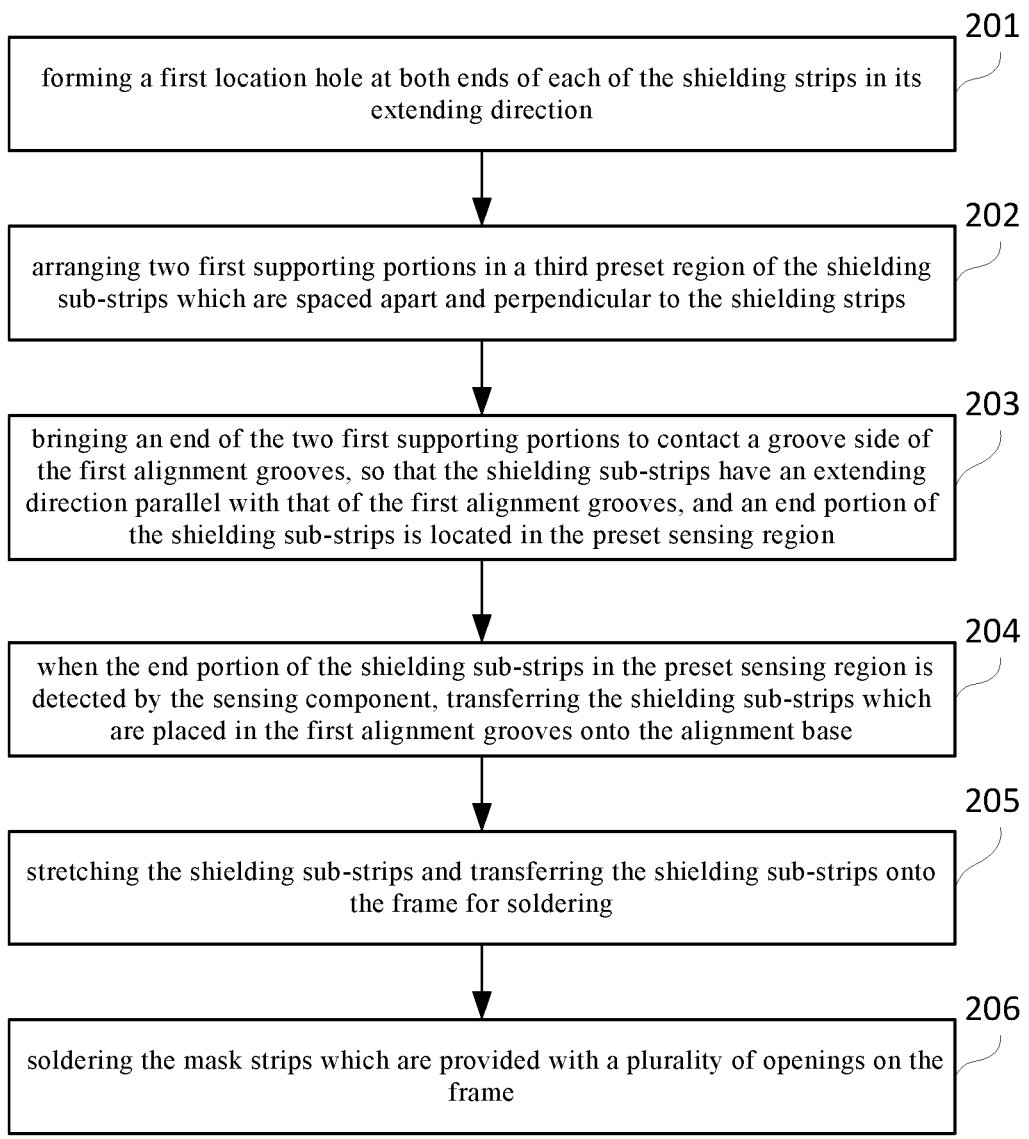
FIG. 10 is a schematic view for illustrating a fabricating process of a mask plate in an embodiment of the present disclosure.

In embodiments of the present disclosure, the method for fabricating a mask plate according to embodiments of the present disclosure will be described with reference to FIG. 10, and a mask plate which comprises shielding sub-strips having a width in a direction perpendicular to the first direction smaller than the third preset value and comprising two first supporting portions in a third preset region is taken as an example.

Step 201, forming a first location hole at both ends of each of the shielding strips in its extending direction, wherein the shielding strips has a first border which is parallel with the first direction, and distances between centers of the first location holes of the shielding strips and the first border of the shielding strips lie in the first threshold range.

Step 202, arranging two first supporting portions in a third preset region of the shielding sub-strips which are spaced apart and perpendicular to the shielding strips, wherein when the shielding sub-strips are placed in the first alignment grooves of the shielding sub-strips for alignment, the third preset region of the shielding sub-strips is located in the first alignment grooves. The shielding sub-strips have a length in the extending direction which is larger than the length of the first alignment grooves. Namely, the first alignment grooves cannot completely bear shielding sub-strips. Portion shielding sub-strips for picking up are further arranged outside both ends of the first alignment grooves. The two first supporting portions are arranged in the third preset region of the shielding sub-strips within the first alignment grooves. By arranging positions of the two first supporting portions and the first alignment grooves, a portion of a relatively narrow shielding sub-strip outside the first alignment grooves can be located in the preset sensing region, thus detected by the respective sensing component, and transferred by the respective transfer component.

Step 203, bringing an end of the two first supporting portions to contact a groove side of the first alignment grooves, so that the shielding sub-strips have an extending direction parallel with that of the first alignment grooves, and an end portion of the shielding sub-strips is located in the preset sensing region. In particular, the first supporting portion can be two strip-shaped first supporting portions which are perpendicular to the shielding sub-strips, and distances from a point where the two strip-shaped first supporting portions are fixed to the shielding sub-strips to a point where the two strip-shaped first supporting portions contact the first alignment grooves are equal. This ensures that when both of the two strip-shaped first supporting portions contact the first alignment grooves, the extending direction of the shielding sub-strips is parallel with the extending direction of the first alignment grooves.

Step 204, when the end portion of the shielding sub-strips in the preset sensing region is detected by the sensing component, transferring the shielding sub-strips which are placed in the first alignment grooves onto the alignment base, and in a field of view of an image sensor, placing the shielding strips in a preset position by means of the first location holes.

Step 205, stretching the shielding sub-strips and transferring the shielding sub-strips onto the frame for soldering.

Step 206, soldering the mask strips which are provided with a plurality of openings on the frame, wherein the mask strips have a same extending direction as that of the shielding strips, and the shielding strips are located in space between neighboring mask strips.

It is noted that, the shielding strips or supporting strips on the mask plate are generally aligned, stretched and soldered one by one. Thus, the method of the present disclosure can be understood as a method for fabricating one of the shielding strips or supporting strips. The above steps can be repeated for the method for fabricating the shielding strips or supporting strips of the whole mask plate, which is not repeated here for simplicity.

Embodiments of the present disclosure provide the following beneficial effects. Distances between the first location holes of the shielding strips with different widths and the first border lie in the first threshold range. As a result, when the shielding strips are placed in the alignment base for positioning, in order to fabricate a mask plate comprising a plurality of shielding strips with different widths, alignment holes can be easily found in a same field of view of the image sensor. It is not necessary to manually adjust the alignment base for several times. This simplifies the fabricating process of the fine mask plate, reduces the fabrication duration of the fine mask plate, and improves the fluent operation during automated fabrication of the mask plate.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A mask plate, comprising a frame and a plurality of mask strips which are fixed to the frame and extend in a first direction, each of the plurality of mask strips is provided with a plurality of openings,
wherein the mask plate further comprises a plurality of shielding strips having a same extending direction as that of the plurality of mask strips, the plurality of shielding strips are arranged in space between neighboring mask strips of the plurality of mask strips and shield a gap between the neighboring mask strips of the plurality of mask strips,
wherein each of the shielding strips of the plurality of shielding strips comprises a first border parallel with the first direction, and each of the shielding strips of the plurality of shielding strips is provided with a first location hole at both ends of its extending direction, some or all of the shielding strips of the plurality of shielding strips have widths in a direction perpendicular to the first direction which are different from one another, and distances between centers of the first location holes of each of the shielding strips of the plurality of shielding strips and the first border of each of the shielding strips of the plurality of shielding strips lie in a first threshold range.

2. The mask plate of claim 1, wherein distances between the centers of the first location holes of each of the shielding strips of the plurality of shielding strips and the first border of each of the shielding strips of the plurality of shielding strips are a first preset value, and the first preset value is a specific value in the first threshold range.

3. The mask plate of claim 1, further comprising a plurality of supporting strips which support the plurality of mask strips and have an extending direction perpendicular to that of the plurality of mask strips,
wherein each of the supporting strips of the plurality of supporting strips comprises a second border perpendicular to the first direction, and each of the supporting strips of the plurality of supporting strips is provided with a second location hole at both ends of its extending direction, some or all of the supporting strips of the plurality of supporting strips have widths in the first direction which are different from one another, and distances between centers of the second location holes of each of the supporting strips of the plurality of supporting strips and the second border of each of the supporting strips of the plurality of supporting strips lies in a second threshold range.

4. The mask plate of claim 3, wherein distances between the centers of the second location holes of each of the supporting strips of the plurality of supporting strips and the second border of each of the supporting strips of the plurality of supporting strips are a second preset value, and the second preset value is a specific value in the second threshold range.

5. The mask plate of claim 3, wherein,
each of the shielding strips of the plurality of shielding strips is further provided with a third location hole at both ends of its extending direction, and the third location hole and the first location hole at a same end are symmetrical with respect to a central axis of each of the shielding strips of the plurality of shielding strips which is parallel with the first direction;
each of the supporting strips of the plurality of supporting strips is further provided with a fourth location hole at both ends of its extending direction, and the fourth location hole and the second location hole at a same end are symmetrical with respect to a central axis of each of the supporting strips of the plurality of supporting strips which is perpendicular to the first direction.

6. The mask plate of claim 3, further comprising auxiliary shielding strips which are arranged in a same layer as and are parallel with the plurality of shielding strips,
wherein each of the auxiliary shielding strips comprises a shielding strip body and shielding strip branches at both sides of the shielding strip body,
the shielding strip body has a width in a direction perpendicular to the first direction which is larger than a width of the shielding strip branches in a direction perpendicular to the first direction,
the shielding strip body comprises a first auxiliary border which is parallel with the first direction, and each of the shielding strip bodies is provided with a first auxiliary location hole at both ends of its extending direction,
distances between the centers of the first auxiliary location holes of each of the auxiliary shielding strips and the first auxiliary border of the auxiliary shielding strips lie in the first threshold range.

7. The mask plate of claim 6, wherein,
each of the auxiliary shielding strips further comprises a first extending portion which is arranged at a side of each of the shielding strip branches away from the shielding strip body, a width of the first extending portion in a direction perpendicular to the first direction is a first preset width, and the first extending portion increases a sensed area of the auxiliary shielding strips, when the auxiliary shielding strips are transferred to an alignment base by sensing during fabrication.

8. The mask plate of claim 6, further comprising auxiliary supporting strips which are arranged in a same layer as and are parallel with the plurality of supporting strips,
wherein each of the auxiliary supporting strips comprises a supporting strip body and supporting strip branches on both sides of the supporting strip body, and the supporting strip body has a width in the first direction which is larger than that of the supporting strip branches;
the supporting strip body comprises a second auxiliary border which is perpendicular to the first direction, and each of the supporting strip bodies is provided with a second auxiliary location hole at both ends of its extending direction; and
distances between centers of the second auxiliary location holes of each of the auxiliary supporting strips and the second auxiliary border of the auxiliary supporting strips lie in the second threshold range.

9. The mask plate of claim 8, wherein,
each of the auxiliary supporting strips further comprises a second extending portion which is arranged at a side of each of the supporting strip branches away from the supporting strip body, a width of the second extending portion in the first direction is a second preset width, and the second extending portion increases a sensed area of the auxiliary supporting strips when the auxiliary supporting strips are transferred to the alignment base by sensing during fabrication.

10. The mask plate of claim 7, wherein,
the plurality of shielding strips having a width in a direction perpendicular to the first direction which is smaller than a third preset value are used as shielding sub-strips, and each of the shielding sub-strips is further provided with a first sensing portion in a first preset region, the first sensing portion increases a sensed area of the shielding sub-strips when the shielding sub-strips are transferred to the alignment base by sensing during fabrication, and the first preset region is a region of each of the shielding sub-strips which corresponds to a preset sensing region during transferring the plurality of shielding strips;

the plurality of supporting strips which have widths in the first direction smaller than a fourth preset value are used as supporting sub-strips, each of the supporting sub-strips is further provided with a second sensing portion in a second preset region, the second sensing portion increases the sensed area of the supporting sub-strips when the supporting sub-strips are transferred to the alignment base by sensing during fabrication, and the second preset region is a region of each of the supporting sub-strips which corresponds to the preset sensing region during transferring the plurality of supporting strips.

11. The mask plate of claim 10, wherein the first sensing portion has a strip-shape, and is perpendicularly fixed to the shielding sub-strips; and the second sensing portion has a strip-shape, and is perpendicularly fixed to the supporting sub-strips.

12. The mask plate of claim 1, wherein, the plurality of shielding strips having a width in a direction perpendicular to the first direction which is smaller than a third preset value are used as shielding sub-strips, and each of the shielding sub-strips is provided with two first supporting portions in a third preset region which are spaced apart and perpendicular to the shielding sub-strips; and in case the shielding sub-strips are placed in first alignment grooves which are used for alignment, the third preset region of the shielding sub-strips are located in the first alignment grooves, and an end of each of the two first supporting portions contacts a groove side of the first alignment grooves, so that when the shielding sub-strips are placed in the first alignment grooves, an end portion of each of the shielding sub-strips is located in a preset sensing region.

13. The mask plate of claim 12, wherein, each supporting strip of the plurality of supporting strips has a width in the first direction smaller than a fourth preset value are used as supporting sub-strips, and each of the supporting sub-strips is further provided with two second supporting portions in fourth preset region which are spaced apart and perpendicular to the supporting sub-strips; in case the supporting sub-strips are placed in second alignment grooves which are used for alignment, the fourth preset region of the supporting sub-strips are located in the second alignment grooves, an end of each of the two second supporting portions contacts a groove side of the second alignment grooves, so that when the supporting sub-strips are placed in the second alignment grooves, an end portion of the supporting sub-strips is located in the preset sensing region.

14. A method for fabricating a mask plate, for fabricating the mask plate of claim 1, wherein the method comprises:

forming the first location hole at both ends of each of the shielding strips of the plurality of shielding strips in its extending direction, wherein the plurality of shielding strips comprises the first border parallel with the first direction, and distances between the centers of the first location holes of each of the shielding strips of the plurality of shielding strips and the first border of each of the shielding strips of the plurality of shielding strips lie in a first threshold range;

placing the plurality of shielding strips on an alignment base, and in a field of view of an image sensor, placing the plurality of shielding strips in a preset position by means of the first location holes;

stretching the plurality of shielding strips and transferring the plurality of shielding strips onto the frame for soldering; and soldering the plurality of mask strips which are provided with plurality of openings onto the frame, wherein the plurality of mask strips have a same extending direction as that of the plurality of shielding strips, and the plurality of shielding strips are located in space between neighboring mask strips of the plurality of mask strips.

15. The method of claim 14, wherein, prior to placing the plurality of shielding strips on the alignment base, the method further comprises: placing the plurality of shielding strips in first alignment grooves which are arranged in a bearing platform, and setting the plurality of shielding strips to have an extending direction parallel with that of the first alignment grooves; and placing the plurality of shielding strips on the alignment base comprises: transferring the plurality of shielding strips which are placed in the first alignment grooves onto the alignment base, when the plurality of shielding strips are detected in a preset sensing region by a sensing component.

16. The method of claim 15, wherein the plurality of shielding strips having a width in a direction perpendicular to the first direction which is smaller than a third preset value are used as shielding sub-strips;

prior to placing the shielding sub-strips in the first alignment grooves which are arranged in the bearing platform, the method further comprises: arranging a first sensing portion for expanding a sensed area in the first preset region of each of the shielding sub-strips; and transferring the plurality of shielding strips which are placed in the first alignment grooves onto the alignment base, when the plurality of shielding strips are detected in the preset sensing region by the sensing component, comprises: transferring the shielding sub-strips which are placed in the first alignment grooves onto the alignment base, when the first sensing portion of the shielding sub-strips is detected in the preset sensing region by the sensing component.

17. The method of claim 15, wherein the plurality of shielding strips having a width in a direction perpendicular to the first direction which is smaller than a third preset value are used as shielding sub-strips;

prior to placing a plurality of the shielding sub-strips in the first alignment grooves which are arranged in the bearing platform, the method further comprises: arranging two first supporting portions in a third preset region of the shielding sub-strips which are spaced apart and perpendicular to the plurality of shielding strips;

placing the plurality of shielding strips in the first alignment grooves which are arranged in the bearing platform, and setting the plurality of shielding strips to have an extending direction parallel with that of the first alignment grooves comprises: bringing an end of each of the two first supporting portions to contact a groove side of the first alignment grooves, so that the shielding sub-strips have an extending direction which is parallel with that of the first alignment grooves, and an end portion of each of the shielding sub-strips is located in the preset sensing region; and transferring the plurality of shielding strips which are placed in the first alignment grooves onto the alignment base, when the plurality of shielding strips are detected in the preset sensing region by the sensing component comprises: transferring the shielding sub-strips which are placed in the first alignment grooves onto the alignment base, when an end portion of each of the shielding sub-strips is detected by the sensing component in the preset sensing region.

18. The method of claim 15, wherein the mask plate further comprises auxiliary shielding strips parallel with the plurality of shielding strips, the auxiliary shielding strips comprise: a shielding strip body and shielding strip branches at both sides of the shielding strip body, and a first extending portion which is arranged at a side of each of the shielding strip branches away from the shielding strip body, the shielding strip body has a width in a direction perpendicular to the first direction which is larger than a width of the shielding strip branches in a direction perpendicular to the first direction, a width of the first extending portion in a direction perpendicular to the first direction is a first preset width; and during transferring of the plurality of shielding strips which are placed in the first alignment grooves onto the alignment base, when the plurality of shielding strips are detected in the preset sensing region by the sensing component, the method further comprises: transferring the auxiliary shielding strips which are placed in the first alignment grooves onto the alignment base, when the first extending portion of the auxiliary shielding strips is detected by the sensing component in the preset sensing region.

* * * * *